US005642425A

United States Patent [19]

Kawakami

[11] Patent Number: 5,642,425

[45] Date of Patent: Jun. 24, 1997

[54] SOUND FIELD CONTROL DEVICE

[75] Inventor: Fukushi Kawakami, Hamamatsu, Japan

[73] Assignee: Yamaha Corporation, Hamamatsu, Japan

[21] Appl. No.: 708,358

[22] Filed: Sep. 4, 1996

Related U.S. Application Data

[63] Continuation of Ser. No. 217,242, Mar. 24, 1994, abandoned.

[30] Foreign Application Priority Data

Mar. 26, 1993 [JP] Japan .................................... 5-092040

[51] Int. Cl.$^6$ .............................. H03G 3/00; H04B 15/00

[52] U.S. Cl. ................................ 381/63; 381/94; 381/83; 381/93; 84/630

[58] Field of Search ................................. 381/63, 61, 62, 381/64, 65, 83, 93, 71, 94; 84/630, 26, 629, 707

[56] References Cited

U.S. PATENT DOCUMENTS

| | | | |
|---|---|---|---|
| 4,581,759 | 4/1986 | Takahashi | 381/63 |
| 4,727,581 | 2/1988 | Bray | 381/63 |
| 5,025,472 | 6/1991 | Shimizu et al. | 381/63 |
| 5,091,983 | 2/1992 | Tretter | 381/71 |
| 5,187,692 | 2/1993 | Waneda et al. | 381/63 |
| 5,201,005 | 4/1993 | Matsushita et al. | 381/63 |
| 5,325,437 | 6/1994 | Doi et al. | 381/71 |

FOREIGN PATENT DOCUMENTS

| | | |
|---|---|---|
| 169897 | 7/1986 | Japan . |
| 11037 | 2/1992 | Japan . |

OTHER PUBLICATIONS

DC–Controlled Audio Switches and Filter Electronics Components and Applications. vol. 2 No. 1., Nov. 1979.

*Primary Examiner*—Curtis Kuntz
*Assistant Examiner*—Xu Mei
*Attorney, Agent, or Firm*—Loeb & Loeb LLP

[57] ABSTRACT

A sound field control device includes an acoustic feedback signal path including a chamber and one or more loudspeaker or loudspeakers and one or more microphone or microphones provided in the chamber, the loudspeakers being disposed at a predetermined distance from the microphones, and at least either the loudspeakers or the microphones being provided in the plural, an electrical feedback signal path for feeding back a collected sound signal collected by the microphone or microphones to the loudspeaker or loudspeakers, and a collected sound signal supply control circuit provided in the electrical feedback signal path for changing, with lapse of time, a signal level of each collected sound signal fed back from the microphones to the loudspeakers. The transmission route of the collected sound signal is completely switched or the ratio of distribution of the collected sound signal is changed. Coloration in hearing is thereby reduced and a margin of howling is expanded without causing unnaturalness in hearing.

16 Claims, 6 Drawing Sheets

SOUND FIELD CONTROL DEVICE

This is a continuation of application Ser. No. 08/217,242 filed Mar. 24, 1994, now abandoned.

BACKGROUND OF THE INVENTION

This invention relates to a device for controlling a sound field of space in a chamber such as a concert hall by using an acoustic feedback system and, more particularly, to a device of this type capable of reducing coloration and expanding a margin of howling without causing unnaturalness in hearing and also improving diffusion characteristics of the acoustic feedback system.

As a conventional device for controlling diffusion in an inner space of a chamber by a mechanical system, a rotary diffusion plate is generally employed. According to this device, a diffusion plate provided in a chamber is continuously rotated through an attenuation process of a reverberation attenuation waveform to timewise change the boundary condition in the chamber. Frequency, propagation route and level of the mode (i.e., standing wave) of the chamber are thereby changed timewise to bring about a state which is equivalent to increase in the number of the mode and thereby to improve the sound field control capability.

There have also been various acoustic feedback type devices as shown, for example, in FIG. 2 which have electro-acoustically realized a sound field control including prolongation of reverberation. These devices will be referred to as "sound control devices" hereafter. In the example of FIG. 2, a loudspeaker 12 and a microphone 14 are disposed at some interval from each other in a chamber 10. A sound collected by the microphone 14 is supplied through a head amplifier 16 to an FIR (finite impulse response) filter 18 to produce a reverberation signal. This reverberation signal is fed back to the loudspeaker 12 through an amplifier 20 and diffusion of the sound field in the chamber 10 is thereby realized. In such acoustic feedback system or sound field control device, however, delay time caused by the distance between the loudspeaker 12 and the microphone 14 is constant and this gives rise to the problem that a sharp peak appears in the frequency axis and this causes coloration in hearing and howling at the peak position.

In the prior art sound field control devices, it has been attempted to prevent occurrence of a sharp peak in the frequency axis and thereby reduce coloration and expand a margin of howling by shifting a parameter of the FIR filter 18 continuously and randomly on the time axis.

Shifting of a parameter of the FIR filter 18 on the time axis, however, produces a change on the frequency axis and this generates distortion due to frequency modulation which causes unnaturalness in hearing. Moreover, the problem of generation of coloration and howling due to the peak dip in the transmission characteristic between the loudspeaker and the microphone remains unsettled.

It is, therefore, an object of the invention to provide a sound field control device capable of reducing coloration and expanding the margin of howling without causing unnaturalness in hearing and also improving controllability of the device.

SUMMARY OF THE INVENTION

For achieving the above described object of the invention, a sound field control device comprises an acoustic feedback signal path including a chamber and one or more loudspeakers and one or more microphones provided in said chamber, said loudspeaker or loudspeakers being disposed at a predetermined distance from said microphone or microphones, and at least either said loudspeakers or said microphones being provided in the plural, an electrical feedback signal path for feeding back a collected sound signal collected by said microphone or microphones to said loudspeaker or loudspeakers, and collected sound signal supply control means provided in said electrical feedback signal path for changing, with lapse of time, a signal level of each collected sound signal fed back from said microphone or microphones to said loudspeaker or loudspeakers.

According to the invention, the transmission route of a collected sound signal is timewise changed among plural transmission routes in the acoustic feedback system which have different distances between one or more loudspeakers and one or more microphones or the ratio of the level of the collected sound signal among these transmission routes is timewise changed and, therefore, the frequency characteristic is flattened owing to the space averaging effect and coloration is thereby reduced and the howling margin is expanded. Moreover, since plural acoustic feedback systems are simultaneously provided, distortion of the signal due to frequency modulation which might otherwise occur in switching of the transmission route will be substantially eliminated and, as a result, unnaturalness in hearing will hardly take place. The simultaneous provision of the plural acoustic feedback systems will also improve the controllability of the device remarkably. Thus, the sound field control device according to the invention can achieve stability of the device, expansion of the width of control (width of variation) and improvement of naturalness in hearing.

Preferred embodiments of the invention will be described below with reference to the accompanying drawings.

BRIEF DESCRIPTION OF THE DRAWINGS

In the accompanying drawings.

DESCRIPTION OF PREFERRED EMBODIMENTS

Figure 1:
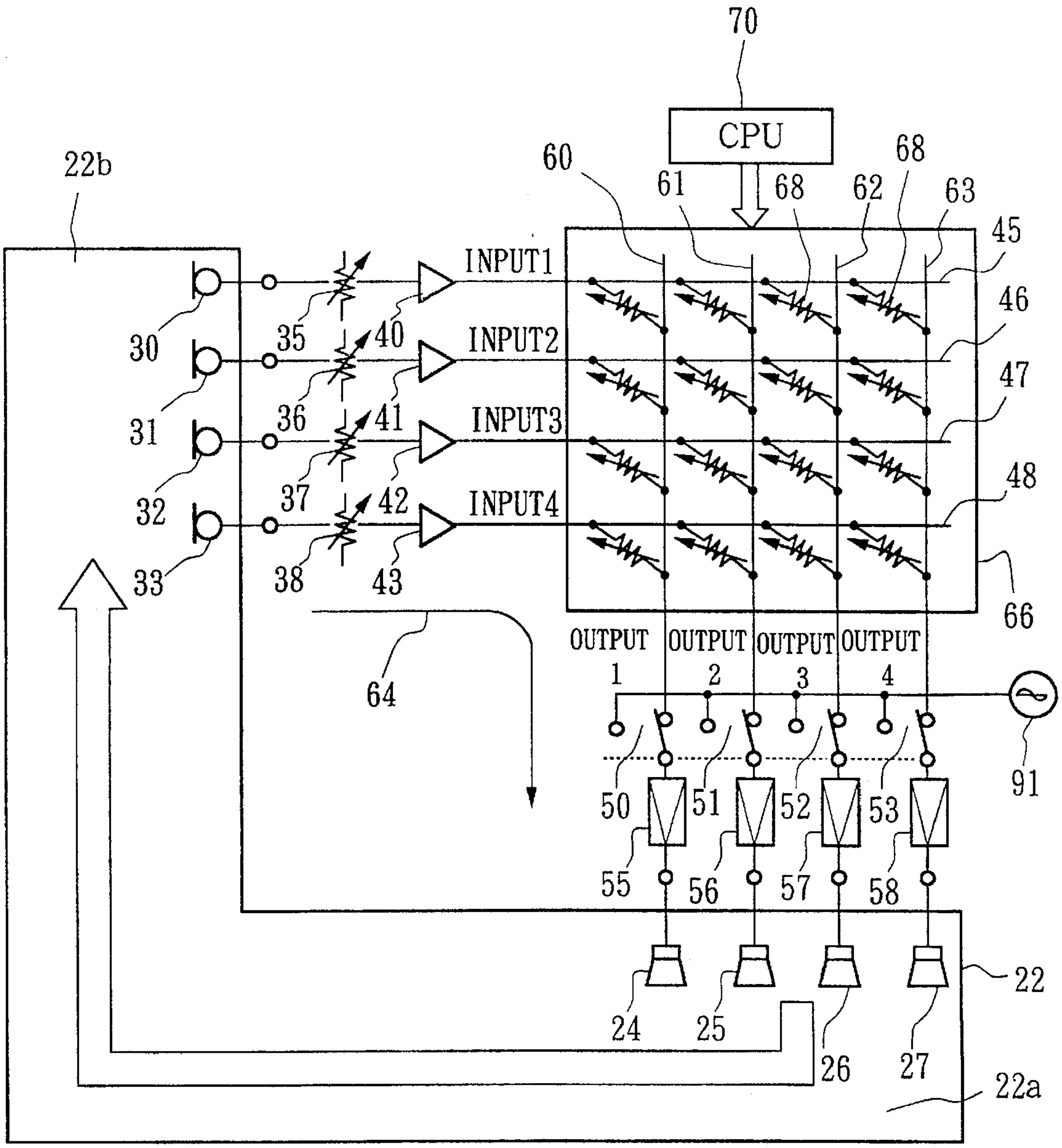
FIG. 1 is a circuit diagram showing an embodiment of the invention.
Figure 2:
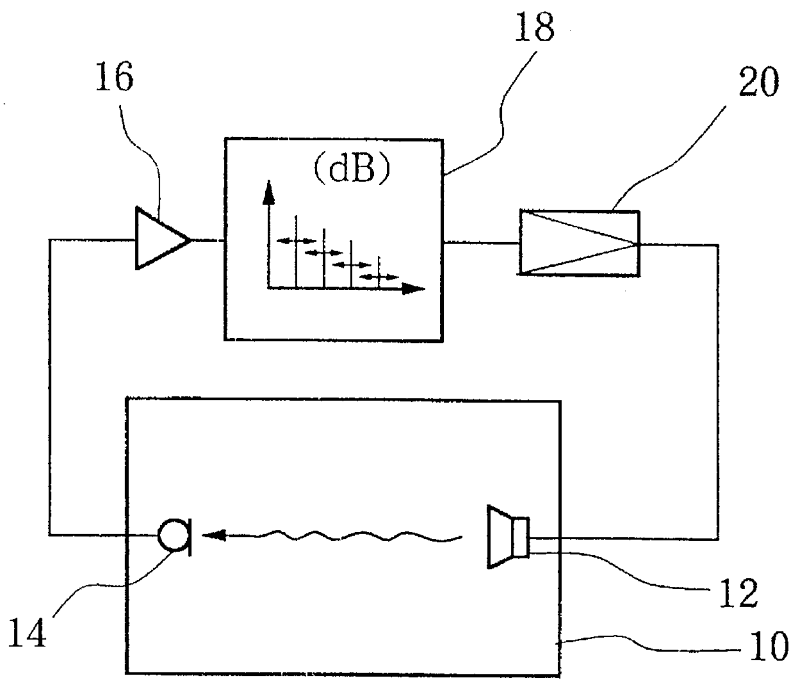
FIG. 2 PRIOR ART
FIG. 2 is a circuit diagram showing an example of prior art sound field control devices.

FIG. 1 shows an embodiment of the invention. A chamber 22 (e.g., a concert hall or a reverberation chamber) is generally L-shaped in plan and has a space **22*a* in one arm portion and a space 22*b* in the other arm portion. Four loudspeakers 24 to 27 are arranged in a line in the space 22*a* at a predetermined interval. It is not necessary to arrange these loudspeakers 24 to 27 at an equal interval. In the space 22*b*, four microphones 30 to 33 are arranged in a line at a predetermined interval. It is not necessary to arrange these microphones 30 to 33 at an equal interval either. There is difference in distances between the loudspeaker 24 and the respective microphones 30 to 33 through the chamber 22. Likewise, there is difference in distances between one of the other loudspeakers 25 to 27 and the respective microphones 30 to 33. The chamber 22, the loudspeakers 25 to 27 and the microphones 30 to 33** constitute the acoustic feedback signal path.

Collected sound signals from the microphones 30 to 33 are fed back to the loudspeakers 24 to 27 through four signal paths 45 to 48 passing through attenuators 35 to 38 and head amplifiers 40 to 43 and four signal paths 60 to 63 passing through switches 50 to 53 and amplifiers 55 to 58. The signal paths 45 to 48 and the signal paths 60 to 63 constitute an electrical feedback signal path 64. These signal paths as a whole constitute plural acoustic feedback systems. The attenuators 35 to 38 are provided in such a manner that the amount of attenuation decreases (i.e., the gain increases) as the distance from the loudspeakers 24 to 27 increases for compensating for difference in the loop gain between the respective acoustic feedback systems.

A control matrix 66 is provided for timewise switching the connection between the signal paths 45 to 48 and the signal paths 60 to 63 and constitutes a matrix circuit which connect the signal paths 45 to 48 with the signal paths 60 to 63 through gain changing circuits 68 each of which is made by, e.g., a VCA (voltage-controlled amplifier). By timewise changing the gain of the respective gain changing circuits 68 gradually by a CPU (central processing unit) 70 while maintaining the entire gain of the four acoustic feedback systems substantially constantly, the connection between the signal paths 45 to 48 and the signal paths 60 to 63 is gradually changed with lapse of time.

Figure 3:
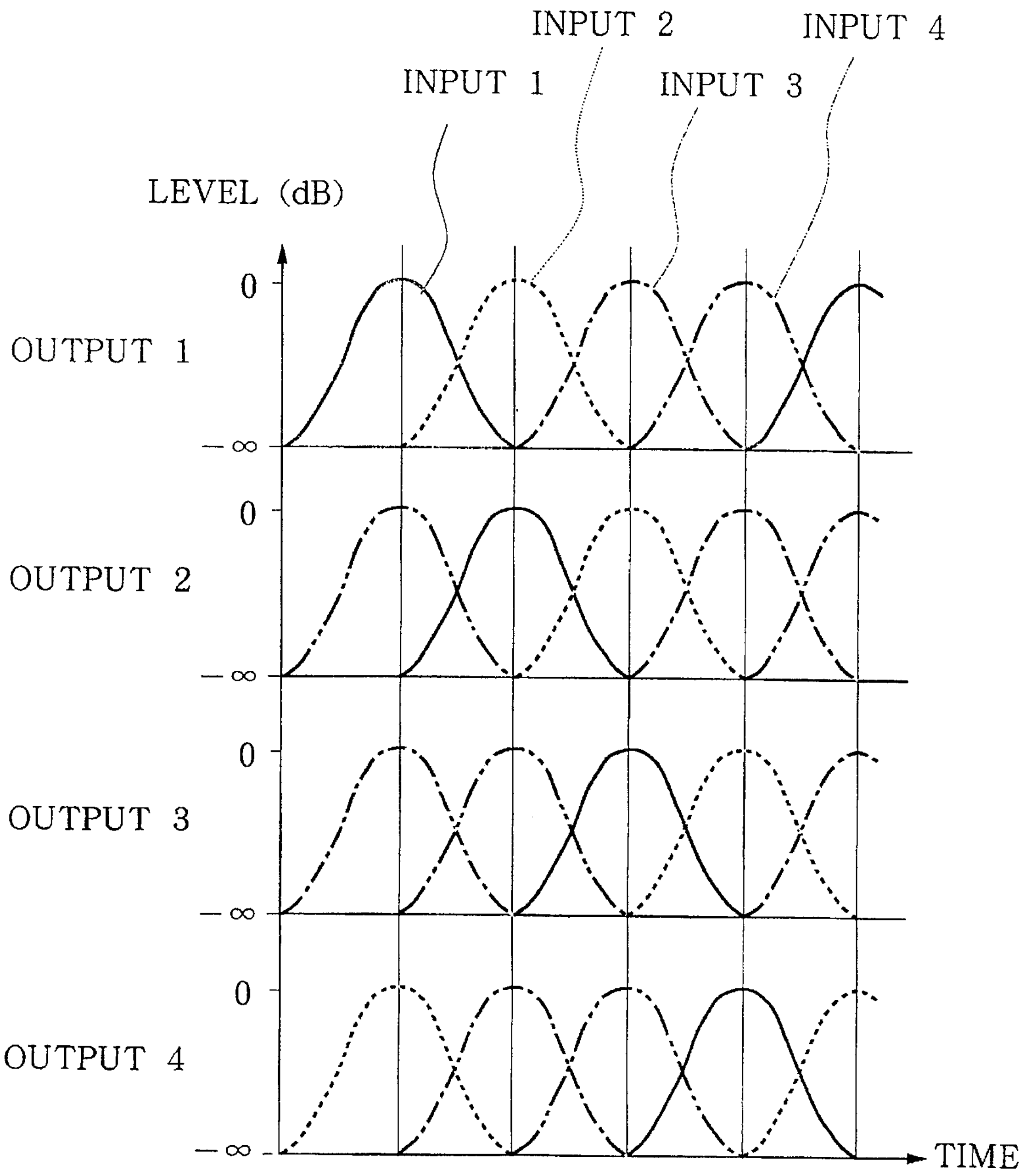
FIG. 3 is a diagram showing change of connection between inputs and outputs in a control matrix 66 by operation of a CPU 70 in FIG. 1.

The state of change in the connection between inputs and outputs of the control matrix 66 caused by the operation of the CPU 70 is shown in FIG. 3. Connection of input 1 is timewise switched from output 1 to output 2 and then outputs 3 and 4. Simultaneously, input 2 is switched from output 4 to outputs 1, 2 and 3 sequentially, input 3 from output 3 to outputs 4, 1 and 2 and input 4 from output 2 to outputs 3, 4 and 1. Each of the inputs 1 to 4 is always connected to either one of the outputs 1 to 4. Depending upon the state of connection, the collected sound signals of the microphones 30 to 33 are fed back to the loudspeakers 24 to 27 and sounded therefrom. Sounds from the loudspeakers 24 to 27 are collected again by the microphones 30 to 33 through the chamber 22.

The interval of switching of the control matrix 66 should be determined in such a manner that the interval is sufficiently large for preventing unnaturalness in hearing and sufficiently small for enabling an adequate degree of the space averaging effect to be obtained. According to experiments, an interval within a range from 0.5 second to several seconds has been found to be most effective.

In the above described manner, the transmission route of the acoustic feedback system and the ratio of signal distribution are constantly changed. In this embodiment, the distance between the loudspeakers 24 to 27 and the microphones 30 to 33 (i.e., delay time) varies among the respective transmission routes and, therefore, the total loop gain of the respective acoustic feedback systems is averaged and the frequency characteristics are averaged. As a result, coloration is reduced and the howling margin is expanded. Moreover, since plural different acoustic feedback systems are simultaneously constructed, occurrence of distortion due to frequency modulation in switching of the transmission route can be prevented, so that unnaturalness in hearing can be prevented. Furthermore, by the simultaneous provision of the plural acoustic feedback systems, the diffusion characteristic can he improved and a reverberation attenuation waveform which is more smooth and nearer to linear attenuation, i.e., a waveform resembling one provided by the rotary diffusion plate can be obtained.

The system of FIG. 1 can be employed for a sound field control for improving acoustic characteristics of the chamber 22, for a sound field reinforcement for reinforcing acoustic characteristics such as sound volume, reverberation and expansion of a sound, and for sound field measurements such as sound absorption rate measurement and reverberation measurement. In a case where a sound field measurement is performed, the switches 50 to 53 are connected to contacts a to enable a tone source signal from one or more tone generators 91 (a band noise generator when the normal constant band noise method is used or a short sound (filtered impulse) generator when the impulse square integration method, i.e., Schroeder method, is used) to be supplied to the loudspeakers 24 to 27 and sounded therefrom. Upon completion of sounding of the tone source signal, the switches 50 to 53 are connected to contacts b to enable the feedback signal path 64 to be formed and the sound field measurement to be performed. Since, as described above, a reverberation attenuation characteristic which is smooth and resembling linear attenuation can be obtained by the system of FIG. 1, an accurate sound field measurement can be realized.

In the above described embodiment, the gain of the gain changing circuits 68 is controlled between −∞dB and 0 dB so that the transmission route is completely changed. Alternatively, the gain of the gain changing circuits 68 may be controlled between a value which is above −∞dB and 0 dB. In this case, the ratio of the signal distribution among the respective transmission routes is timewise changed without completely switching the transmission route from one route to another.

Figure 4:
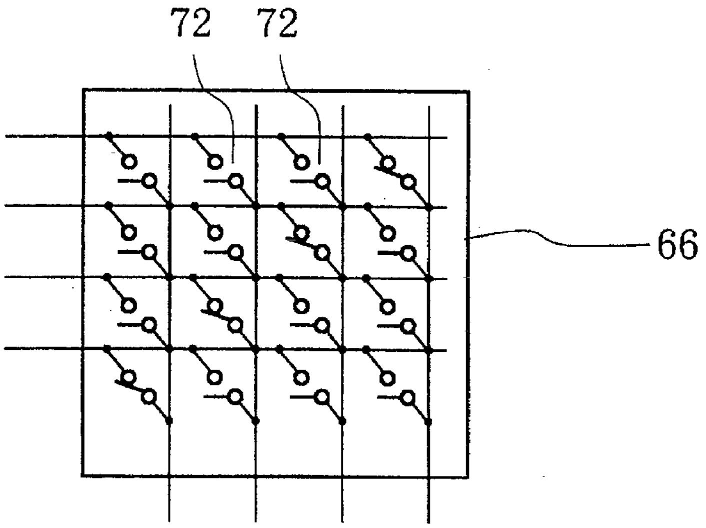
FIG. 4 is a circuit diagram showing an example of the control matrix composed of analog switches.
Figure 5:
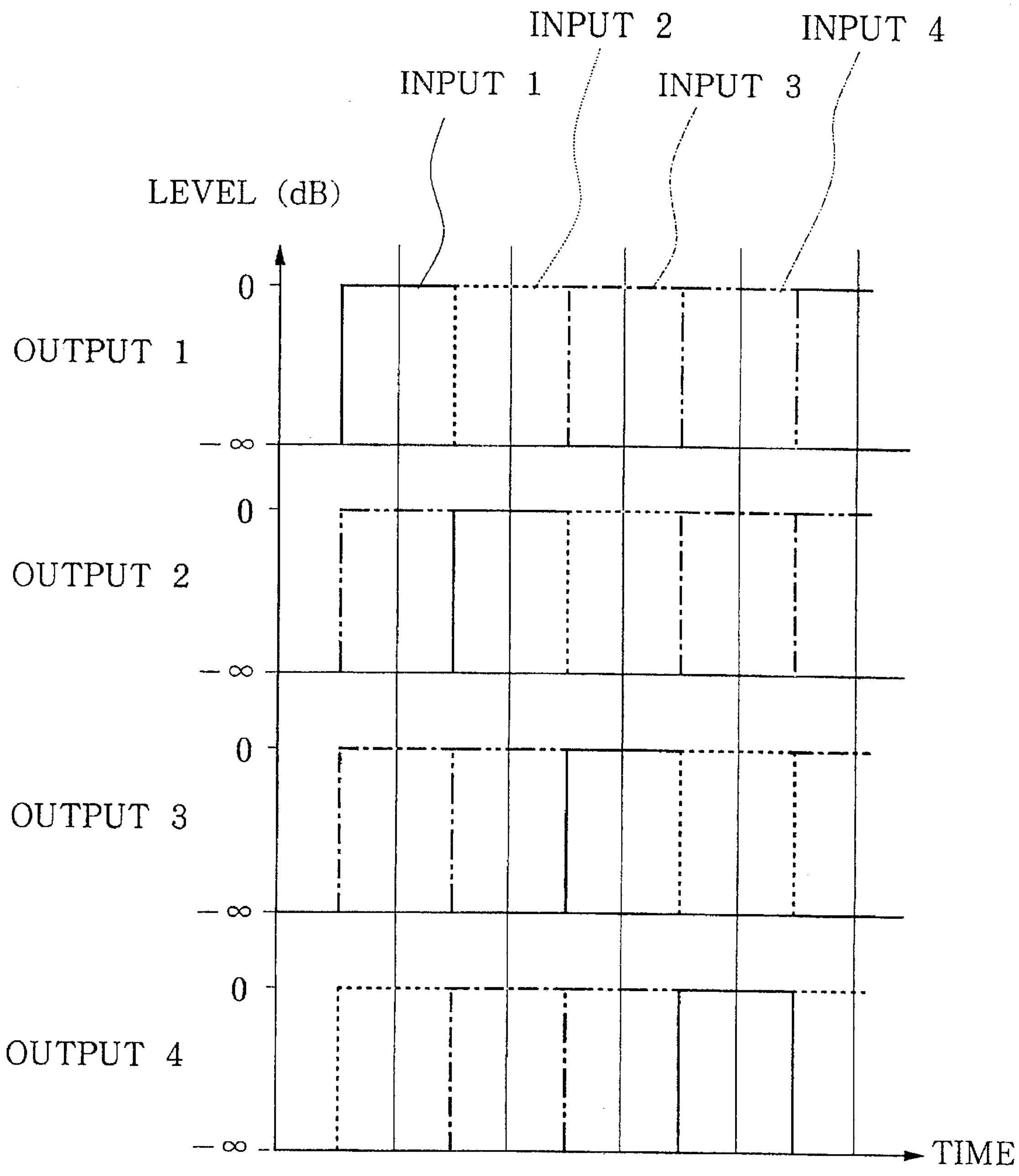
FIG. 5 is a diagram showing change of connection between inputs and outputs in the control matrix 66 by operation of the CPU 70 in FIG. 4.

For completely switching the transmission route from one route to another, the gain changing circuits 68 may be replaced by analog switches 72 shown in FIG. 4. In this case, the state of connection between the inputs and outputs in the control matrix 65 caused by the operation of the CPU 70 is changed, for example, to the state shown in FIG. 5. In this case also, each of the inputs 1 to 4 is always connected to either one of the outputs 1 to 4.

In the above described first embodiment, no delay element is provided in the electrical signal path 64. Alternatively, a delay element such as an FIR filter may be provided in each signal path. In this case, by differing parameters of the FIR filters for the respective signal paths, the diffusion characteristics will be further improved.

Figure 6A:
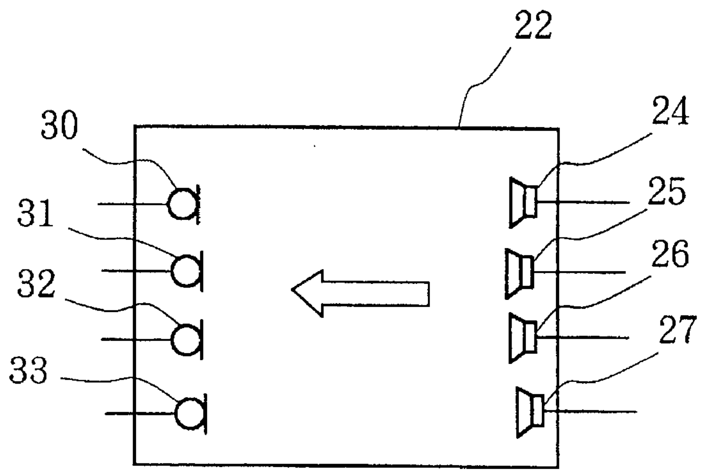
FIGS. 6A, 6B and 6C are diagrams showing plan views of chambers in other embodiments of the invention.
Figure 6B:
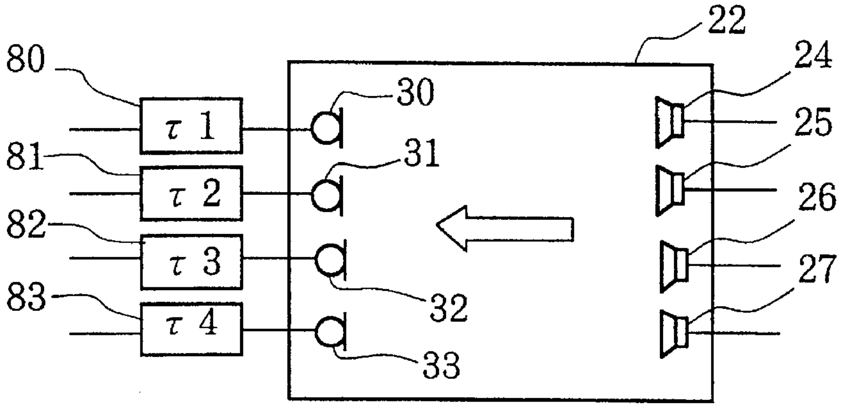

In the above described first embodiment, the chamber 22 is constructed in an L-shape for providing a large distance between the loudspeakers 24 to 27 and the microphones 30 to 33 and also for varying distances between the respective loudspeakers 24 to 27 and the respective microphones 30 to 33 from one another. The chamber used in the invention is not limited to such L-shaped chamber. For example, as shown in FIG. 6A, loudspeakers 24 to 27 may be arranged in a line along a wall of one side of a chamber 22 and microphones 30 to 33 may be arranged in a line along a wall of the opposite side of the chamber 22. Even in this arrangement, distances between the loudspeaker 24 (25, 26 or 27) and the microphones 30 to 33 vary slightly and, therefore, the diffusion effect to some degree can be obtained. FIG. 6B shows another embodiment in which delay circuits 80 to 83 are provided for the microphones 30 to 33 of FIG. 6A. Delay time of these delay circuits 80 to 83 varies from one another (e.g., τ1>τ2>τ3>τ4) so that different delay times as in the embodiment of FIG. 1 can be obtained.

Figure 6C:
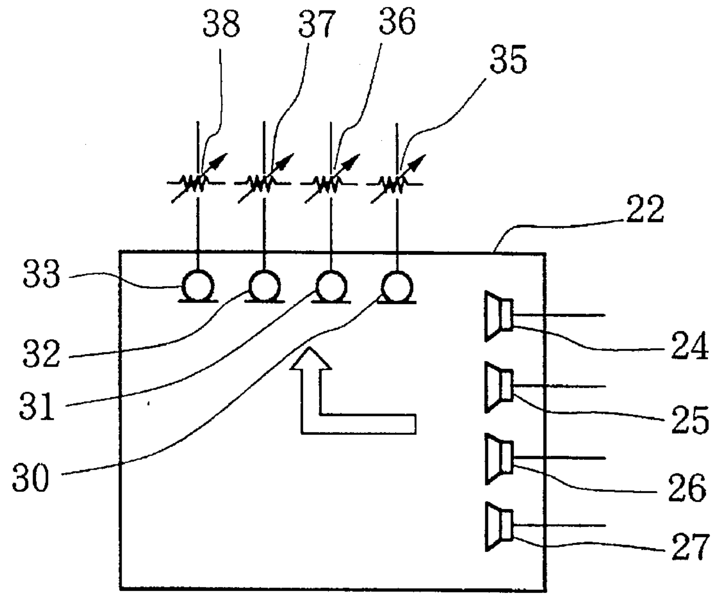

FIG. 6C shows another embodiment of the invention. In this embodiment, the microphones 30 to 33 are arranged in a line along a wall of a side adjacent to the side along which the loudspeakers 24 to 27 are arranged. According to this arrangement, greater differences between the loudspeaker 24 (25, 26 or 27) and the microphones 30 to 33 can be obtained than in the embodiments of FIGS. 6A and 6B. In the embodiment of FIG. 6C, by attenuating, by means of the attenuators 35 to 38, a collected sound signal by a larger amount for a microphone which is nearer to the loudspeaker 24 (25, 26 or 27), difference in the loop gain among the transmission routes of the respective acoustic feedback systems can be corrected.

Figure 7A:
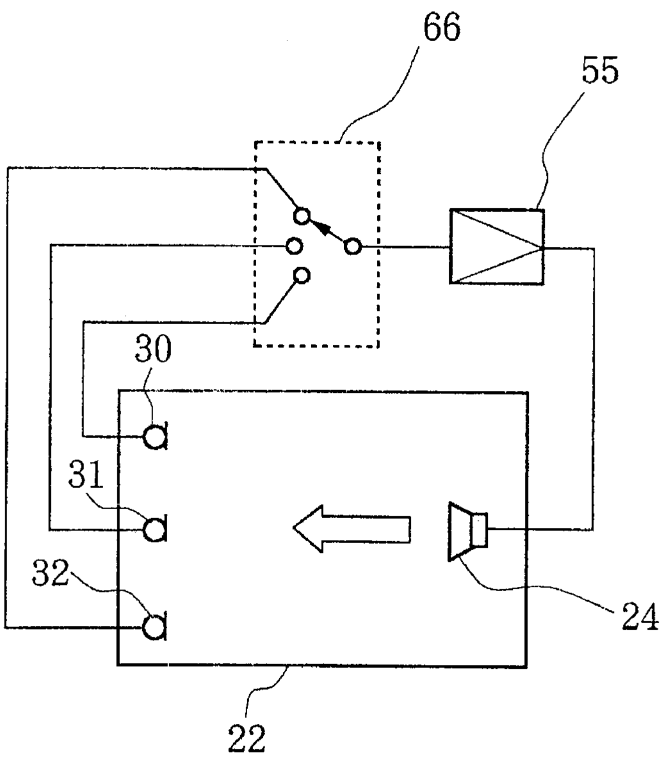
FIGS. 7A and 7B are circuit diagrams showing still other embodiments of the invention.
Figure 7B:
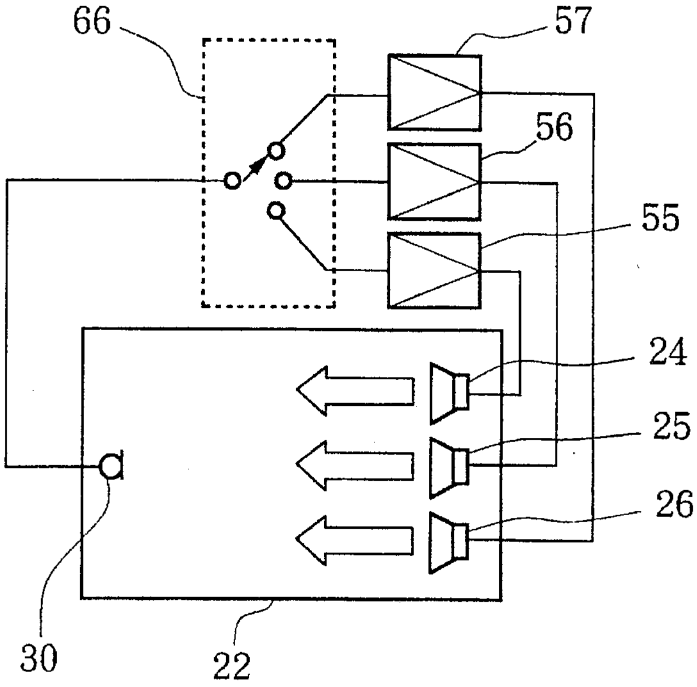

In the above described embodiments, four loudspeakers and four microphones are provided but the numbers of the loudspeakers and microphones are not limited to four. The number of the loudspeakers need not be the same as the number of the microphones. For example, as shown in FIG. 7A, a plurality of collected sound signals may be timewise switched to supply a single collected sound signal to a single loudspeaker 24. Alternatively, as shown in FIG. 7B, a single collected sound signal may be timewise switched to be supplied to one of a plurality of loudspeakers 24, 25 and 26. Further, a plurality of collected sound signals may be added together.

What is claimed is:

1. A sound field control device for controlling a sound field characteristic in a chamber, comprising:

a plurality of loudspeakers provided in the chamber;

a plurality of microphones provided in the chamber;

a plurality of acoustic feedback signal paths formed between each of the plurality of loudspeakers and each of the plurality of microphones, wherein a length of each of the plurality of acoustic feedback signal paths is different in length than others of the plurality of acoustic feedback signal paths;

a plurality of electrical feedback signal paths for electrically feeding back collected sound signals collected by the plurality of microphones to the plurality of loudspeakers; and a collected sound signal supply control circuit provided in the plurality of electrical feedback signal paths for selectively connecting the plurality of electrical feedback paths over a lapse of time to selectively connect one of the plurality of acoustic feedback signal paths for each one of the plurality of loudspeakers and each one of the plurality of microphones to flatten a frequency characteristic of the sound field characteristic to achieve a space averaging effect so that coloration is reduced and a howling margin is expanded.

2. A sound field control device as defined in claim 1, wherein the collected sound signal supply control circuit includes a gain control circuit that variably changes a gain for each collected sound signal supplied to the plurality of loudspeakers over the lapse of time.

3. A sound field control device as defined in claim 2, wherein the gain of the gain control circuit for each collected sound signal is variably changed between −∞dB and 0 dB.

4. A sound field control device as defined in claim 2, wherein the gain of the gain control circuit for each collected sound signal is variably changed between a value above 0 dB.

5. A sound field control device as defined in claim 1, wherein the collected sound signal supply control circuit includes a switch circuit that variably turns on or off the plurality of electrical feedback signal paths over the lapse of time.

6. A sound field control device as defined in claim 1, further including an electrical delay circuit provided in the plurality of electrical feedback signal paths that electrically delays the collected sound signals collected by the plurality of microphones.

7. A sound field control device as defined in claim 6, wherein the electrical delay circuit includes at least one FIR filter.

8. A sound field control device as defined in claim 1, wherein the chamber is an L-shaped chamber and the plurality of loudspeakers are arranged in one arm portion of the L-shaped chamber and the plurality of microphones are arranged in another arm portion of the L-shaped chamber.

9. A sound field control device as defined in claim 1, wherein the chamber is a square chamber and the plurality of loudspeakers are arranged along a wall of one side of the chamber and the plurality of microphones are arranged along a wall of the opposite side of the chamber.

10. A sound field control device as defined in claim 9, which further includes a delay circuit provided for each of the plurality of microphones for delaying the collected sound signals collected by the plurality of microphones.

11. A sound field control device as defined in claim 1, wherein the chamber is a square chamber and the plurality of loudspeakers are arranged along a wall of one side of the chamber and the plurality of microphones are arranged along a wall of another side of the chamber adjacent to the side along which the plurality of loudspeakers are arranged.

12. A sound field control device as defined in claim 1, wherein the collected sound signal supply control circuit sequentially connects the plurality of electrical feedback signal paths over the lapse of time.

13. A sound field control device as defined in claim 1, wherein the collected sound signal supply control circuit randomly connects the plurality of electrical feedback signal paths over the lapse of time.

14. A sound field control device for controlling a sound field characteristic in a chamber, comprising:

a plurality of acoustic feedback signal paths, each including a loudspeaker and a microphone disposed in the chamber and each outputting an electrical signal received by the microphone, wherein a length of each of the plurality of acoustic feedback signal paths is different in length than others of the plurality of acoustic feedback signal paths;

a plurality of electrical feedback signal paths including a plurality of column signal lines connected to each microphone and a plurality of row signal lines connected to each loudspeaker, wherein the plurality of column signal lines and the plurality of row signal lines are disposed in a matrix; and a control circuit that selectively connects the column signal lines and the row signal lines of the plurality of electrical feedback signal paths over a lapse of time to selectively connect some of the plurality of acoustic feedback signal paths to flatten a frequency characteristic of the sound field characteristic to achieve a space averaging effect so that coloration is reduced and a howling margin is expanded.

15. A sound field control device for controlling a sound field characteristic in a chamber, comprising:

a loudspeaker disposed in the chamber and having an input;

a plurality of microphones disposed in the chamber and each having an output, wherein the plurality of microphones are disposed in different positions relative to each other;

a plurality of acoustic feedback signal paths that are formed between the loudspeaker and the plurality of microphones in the chamber, wherein the plurality of acoustic feedback signal paths each have a different length from each other; and an electrical signal supply circuit provided between the input of the loudspeaker and outputs of the plurality of microphones for selectively connecting the input of the loudspeaker with one of the plurality of outputs of the plurality of microphones over a lapse of time to selectively connect one of the plurality of acoustic feedback signal paths for the loudspeaker and one of the plurality of microphones to flatten a frequency characteristic of the sound field characteristic to achieve a space averaging effect so that coloration is reduced and a howling margin is expanded.

16. A sound field control device for controlling a sound field characteristic in a chamber, comprising:

a microphone disposed in the chamber and having an output;

a plurality of loudspeakers disposed in the chamber and each having an input, wherein the plurality of loudspeakers are disposed in different positions relative to each other;

a plurality of acoustic feedback signal paths in the chamber that are formed between the microphone and the plurality of loudspeakers, wherein the plurality of acoustic feedback signal paths each have a different length from each other; and an electrical signal supply circuit provided between the output of the microphone and the inputs of the plurality of loudspeakers for selectively connecting the output of the microphone with one of the plurality of inputs of the loudspeakers over a lapse of time to selectively connect one of the plurality of acoustic feedback signal paths for one of the plurality of loudspeakers and the microphone to flatten a frequency characteristic of the sound field characteristic to achieve a space averaging effect so that coloration is reduced and a howling margin is expanded.

* * * * *